(12) United States Patent
Schrems et al.

(10) Patent No.: US 6,235,651 B1
(45) Date of Patent: May 22, 2001

(54) PROCESS FOR IMPROVING THE THICKNESS UNIFORMITY OF A THIN LAYER IN SEMICONDUCTOR WAFER FABRICATION

(75) Inventors: Martin Schrems, Langebrück/Dresden (AT); Helmut Horst Tews, Poughkeepsie, NY (US)

(73) Assignee: Infineon Technologies North America, San Jose, CA (US)

( * ) Notice: Subject to any disclaimer, the term of this patent is extended or adjusted under 35 U.S.C. 154(b) by 0 days.

(21) Appl. No.: 09/395,952

(22) Filed: Sep. 14, 1999

(51) Int. Cl.$^7$ ............ H01L 21/31; H01L 21/469
(52) U.S. Cl. ............ 438/787; 438/770; 438/773
(58) Field of Search ............ 438/770, 773, 438/787

(56) References Cited

U.S. PATENT DOCUMENTS

| | | | |
|---|---|---|---|
| 4,584,205 | * 4/1986 | Chen et al. | 427/93 |
| 5,817,581 | * 10/1998 | Bayer et al. | 438/770 |
| 5,851,892 | * 12/1998 | Lojek et al. | 438/305 |

* cited by examiner

Primary Examiner—Richard Booth
Assistant Examiner—Alexander G. Ghyka
(74) Attorney, Agent, or Firm—Stanton Braden

(57) ABSTRACT

A two-step progressive thermal oxidation process is provided to improve the thickness uniformity of a thin oxide layer in semiconductor wafer fabrication. A semiconductor wafer, e.g., of silicon, with a surface subject to formation of an oxide layer thereon but which is substantially oxide layer-free, is loaded, e.g., at room temperature, into an oxidation furnace maintained at a low loading temperature, e.g., of 400–600° C., and the wafer temperature is adjusted to a low oxidizing temperature, e.g., of 400–600° C., all while the wafer is under an inert, e.g., nitrogen, atmosphere. The wafer is then subjected to initial oxidation, e.g., in dry oxygen, at the low oxidizing temperature to form a uniform initial thickness oxide, e.g., silicon dioxide, layer, e.g., of up to 10 angstroms, on the surface, after which the furnace temperature is increased to a high oxidizing temperature, e.g., of 700–1200° C., while the wafer is under an inert atmosphere. The wafer is next subjected to final oxidation, e.g., in oxygen and/or water vapor, at the high oxidizing temperature to increase uniformly the oxide layer to a selective final thickness, e.g., of 20–100 angstroms, whereupon the resultant uniform final thickness oxide layer-containing wafer is recovered from the furnace.

18 Claims, 2 Drawing Sheets

PROCESS FOR IMPROVING THE THICKNESS UNIFORMITY OF A THIN LAYER IN SEMICONDUCTOR WAFER FABRICATION

FIELD OF INVENTION

This invention relates to a process for improving the thickness uniformity of a thin oxide layer on a semiconductor wafer, and more particularly, to a process having two progressive thermal oxidation steps for forming a uniform thickness oxide layer on a semiconductor wafer, as well as to the semiconductor wafer thereby produced. As used herein, "semiconductor wafer" means any microelectronic device, substrate, chip or the like, e.g., of silicon, used to provide an integrated circuit or other related circuitry structure, and in particular capable of forming an oxide layer in situ on a surface thereof.

BACKGROUND OF THE INVENTION

In fabricating microelectronic semiconductor devices and the like on a semiconductor wafer (substrate or chip), e.g., of silicon, to form an integrated circuit (IC), etc., various metal layers and insulation layers are deposited in selective sequence, and in some cases oxide layers are grown in situ on the wafer. To maximize integration of device components in the available wafer area to fit more components in the same area, increased IC miniaturization is utilized Reduced pitch dimensions are needed for denser packing of components per present day very large scale integration (VLSI), e.g., at sub-micron (below 1 micron, i.e., 1,000 nanometer or 10,000 angstrom) dimensions.

A typical conventional oxide layer formation process used in the IC fabrication of a semiconductor wafer involves a one-step thermal oxidation of a surface thereof in an oxidation furnace, e.g., of quartz. The wafer, e.g., at room temperature, i.e., about 20° C., is loaded, e.g., progressively, via a boat containing a row of successive wafers, into the furnace which is maintained at a low loading temperature, e.g., of about 400–600° C., and the temperature of the furnace is "ramped up", i.e., increased, along with the temperature of the wafer, to a high oxidizing temperature, e.g., of about 700–1200° C. The wafer surface is then subjected to oxidation to grow in situ the oxide layer thereon. After the oxide layer is so grown, the furnace temperature is "ramped down", i.e., decreased, to a low unloading temperature, e.g., of about 400–600° C., and the wafer is unloaded from the furnace for further processing.

In general, the oxidation furnace is operated 24 hours a day, and never cools down to room temperature. Instead, the furnace varies from a low loading or unloading temperature, e.g., of about 400–600° C., to a high oxidizing temperature, e.g., of about 700–1200° C. Hence, during the loading of the row of room temperature wafers into the furnace, the leading wafer is exposed to the heating conditions in the furnace significantly earlier than the trailing wafer, whereas the trailing wafer is correspondingly exposed to the exterior ambient air significantly longer than the leading wafer.

In particular, silicon dioxide ($SiO_2$) is in most cases grown in situ as a high temperature stable insulating oxide on silicon. The oxide thickness uniformity within a given wafer and from wafer to wafer, as well as the reproducibility, i.e., from run to run, of the desired target thickness is of great importance for modern semiconductor circuits with small design ground rules and small oxide thicknesses.

One major problem is to control significantly the interim time between a typically contemplated wafer precleaning step, e.g., chemical precleaning by etching with buffered HF solution, and the beginning of the in situ thermal oxidation. During this interim time, a native oxide grows in situ on the silicon wafer at room temperature followed by a low temperature oxide which grows during loading and during ramp up to the high oxidizing temperature.

The last processing step before the deposition of a thermal oxide, i.e., before the thermal oxidation for growing the oxide in situ, is usually a wafer precleaning step, as noted above. During this precleaning step, the previously grown native oxide, which forms on mere contact with air at room temperature, i.e., about 20° C., is removed. Unfortunately, after the precleaning step, a new oxide layer starts growing on the silicon wafer as a native oxide at room temperature unless the precleaning step is performed in an inert atmosphere, i.e., under an inert ambient such as nitrogen, argon, or other inactive gas, and also as a low temperature oxide unless the wafer is loaded into the oxidation furnace without coming into contact with ambient air.

The thickness of the new oxide layer grown at room temperature depends mainly on the duration between the precleaning step and the incorporation, i.e., progressive loading, of the wafer into the oxidation furnace. In practice, this time is difficult to control in a fabrication environment. This is mainly because the leading wafer in the row of wafers being loaded into the furnace is exposed to the heating conditions in the furnace significantly earlier than the trailing wafer, whereas the trailing wafer is correspondingly exposed to the exterior ambient air significantly longer than the leading wafer. As a result, the oxide layer which is produced by the usual one-step thermal oxidation process is non-uniform in thickness and extent, and thus non-homogeneous in character.

It is desirable to have a process providing improved thickness uniformity of a thin oxide layer in semiconductor wafer fabrication, within the given wafer and from wafer to wafer, with reproducibility from run to run of the desired target thickness, which creates more ideal or uniform starting conditions for the thermal oxidation of the wafer surface so as to render less important or inconsequential any uncontrolled formation of an oxide layer during the interim time between a wafer precleaning step and the beginning of the thermal oxidation.

SUMMARY OF THE INVENTION

The foregoing drawbacks are obviated in accordance with the present invention by providing a two-step thermal oxidation process for improving the thickness uniformity of a thin oxide layer in semiconductor wafer fabrication. The improved thickness uniformity is attained within the given wafer and from wafer to wafer, with reproducibility from run to run of the desired target thickness, because the present invention creates more ideal or uniform starting conditions for the thermal oxidation of the wafer surface which render less important or inconsequential any uncontrolled formation of an oxide layer during the interim time between a wafer precleaning step and the beginning of the thermal oxidation.

The process comprises the main steps of:
loading a semiconductor wafer having a surface which is subject to formation of an oxide layer thereon but which is substantially oxide layer-free, into an oxidation furnace under an inert atmosphere while maintaining the furnace at a low loading temperature;
adjusting the temperature of the wafer in the furnace to a low oxidizing temperature while maintaining the wafer under an inert atmosphere;

subjecting the wafer to initial oxidation at the low oxidizing temperature sufficiently to form a substantially uniform initial thickness oxide layer on the wafer surface;

increasing the temperature of the furnace to a high oxidizing temperature while maintaining the wafer under an inert atmosphere;

subjecting the wafer to final oxidation at the high oxidizing temperature sufficiently to increase uniformly the thickness of the oxide layer to a selective final thickness; and recovering the resultant substantially uniform final thickness oxide layer-containing wafer from the furnace.

More particularly, the recovering of the wafer includes the further steps of:

decreasing the temperature of the furnace to a low unloading temperature under an inert atmosphere sufficiently for unloading the wafer from the furnace without significant further oxidation of the wafer surface; and unloading the resultant substantially uniform final thickness oxide layer-containing wafer from the furnace.

Desirably, the low loading temperature is about 400–600° C., the low oxidizing temperature is about 400–600° C., the high oxidizing temperature is about 700–1200° C., the low unloading temperature is about 400–600° C. Typically, the wafer is subjected to oxidation at the low oxidizing temperature for about 15–30 minutes at about 1 atm pressure, then the temperature is increased from the low oxidizing temperature to the high oxidizing temperature over a period of about 15–30 minutes, and the wafer is subjected to oxidation at the high oxidizing temperature for about 5–15 minutes at about 1 atm pressure.

Advantageously, the oxidation at the low oxidizing temperature is carried out in the presence of dry oxygen, and the oxidation at the high oxidizing temperature is carried out in the presence of oxygen and/or water vapor.

In particular, the oxidation at the low oxidizing temperature is carried out sufficiently to form an oxide layer having an initial thickness of up to about 10 angstroms (i.e., 0.001 micron or 1 nm), and the oxidation at the high oxidizing temperature is carried out sufficiently to increase the oxide layer to a final thickness of about 20–100 angstroms (i.e., 0.002–0.01 micron or 2–10 nm). Desirably, the wafer comprises silicon and the oxide layer comprises silicon dioxide. Also, the surface of the wafer is conveniently precleaned, e.g., chemically precleaned by use of a buffered HF etching solution, to provide such surface in substantially oxide layer-free condition.

The present invention also contemplates the substantially uniform thickness oxide layer-containing semiconductor wafer which is produced by the above two-step progressive thermal oxidation process.

Advantageously, the two-step progressive thermal oxidation process of the invention creates a very uniform thin first oxide layer by a first low temperature oxidation process step followed by a second oxidation process step at a higher temperature to grow further the thin oxide layer to the desired final oxide uniform thickness.

The invention will be more readily understood from the following detailed description taken with the accompanying drawings and claims.

It is noted that the drawings are not to scale, some portions being shown exaggerated to make the drawings easier to understand.

DETAILED DESCRIPTION

Figure 1:
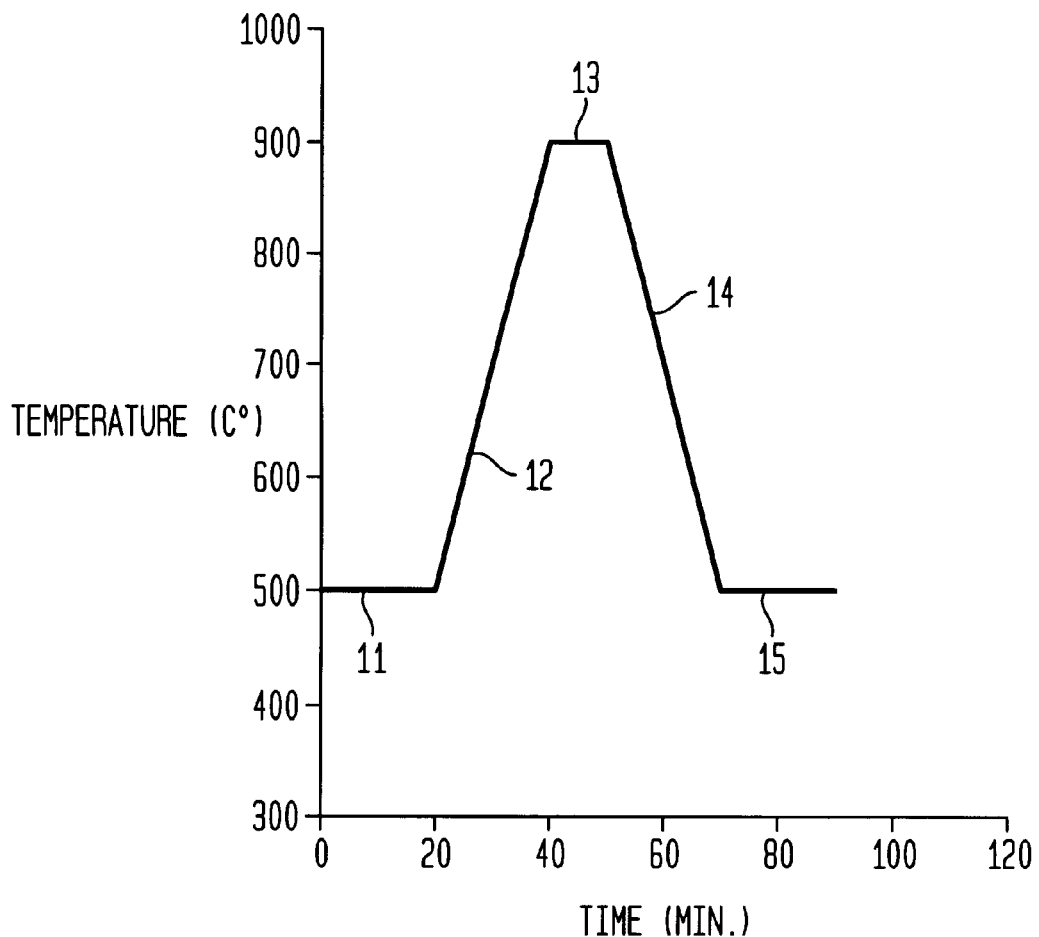
FIG. 1 is a graph having a curve of time versus temperature for the one-step thermal oxidation process for growing a silicon dioxide layer in situ on a surface of a silicon semiconductor wafer in accordance with the prior art.

Referring now to FIG. 1, there is shown a graph having a curve of time in minutes (x-axis, abscissa) versus temperature in °C. (y-axis, ordinate), formed of curve sections 11—loading, 12—ramp up, 13—oxidation, 14—ramp down, and 15—unloading, for a prior art one-step thermal oxidation process for growing a silicon dioxide (oxide) layer in situ on a surface of a silicon semiconductor wafer.

The graph of FIG. 1 illustrates a typical conventional oxide layer formation process used in the IC fabrication of a semiconductor wafer for the one-step thermal oxidation of a surface thereof in an oxidation furnace, e.g., a bottom end loaded vertical furnace of quartz. The wafer, e.g., at room temperature, i.e., about 20° C., is loaded, e.g., over a period of about 20 minutes, into the furnace, e.g., via a quartz boat containing a row of successive wafers inserted progressively upwardly into a bottom opening of the furnace such that the boat, upon completion of the loading, forms a closure for the furnace opening, in conventional manner. During this time, the furnace is maintained at a low loading temperature, e.g., of about 400–600° C., such as about 500° C. (curve section 11—loading).

After the loading, the temperature of the furnace is "ramped up", i.e., increased, along with the temperature of the wafer, e.g., over a period of about 20 minutes, to a high oxidizing temperature, e.g., of about 700–1200° C., such as about 900° C. (curve section 12—ramp up).

The wafer surface is then subjected to one-step thermal oxidation at the high oxidizing temperature, e.g., over a period of about 10 minutes (curve section 13—oxidation), to grow in situ the oxide layer thereon, e.g., in the presence of oxygen and/or water vapor. After the oxide layer is so grown, the furnace temperature is "ramped down", i.e., decreased, e.g., over a period of about 20 minutes, to a low unloading temperature, e.g., of about 400–600° C., such as about 500° C. (curve section 14—ramp down), and the wafer is unloaded from the furnace, e.g., over a period of about 20 minutes (curve section 15 unloading), in conventional manner for further processing.

Figure 2:
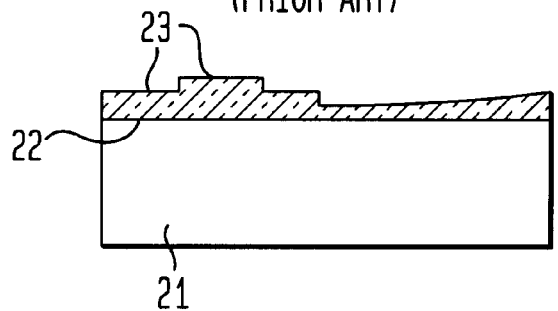
FIG. 2 is a side sectional view of a silicon semiconductor wafer having a silicon dioxide layer formed thereon per the prior art one-step oxidation process contemplated in FIG. 1.

FIG. 2 is a side sectional view of a silicon semiconductor wafer 21 having a surface 22 on which a silicon dioxide (oxide) layer 23 is formed in situ per the prior art one-step thermal oxidation process illustrated in FIG. 1. Silicon dioxide layer 23 is non-uniform in thickness and extent, and thus non-homogeneous in character. Wafer 21 lacks thickness uniformity in its oxide layer 23 and such lack of thickness uniformity will randomly extend from wafer to wafer and from run to run.

Although surface 22 of wafer 21 is typically precleaned, e.g., chemically precleaned by etching with buffered HF solution, in conventional manner to remove all traces of contaminants and in situ grown native oxide layers so as to provide it as a substantially oxide layer-free surface, the prior art one-step oxidation process per FIG. 1 is carried out without sufficiently controlling the interim time between the wafer precleaning and the beginning of the in situ thermal oxidation (curve section 11—loading, and curve section 12—ramp up). During this interim time, a new oxide layer 23 grows in situ randomly on surface 22 of silicon wafer 21, first at room temperature as a native oxide on exposure to ambient air and then as a low temperature oxide which grows during loading (curve section 11—loading) and further during ramp up to the high oxidizing temperature (curve section 12—ramp up).

The thickness of the new oxide layer grown at room temperature depends mainly on the duration between the precleaning step and the inclusion of the wafer into the oxidation furnace, a time duration which is difficult to control, as aforesaid. Accordingly, the overall oxide layer 23 which is produced by the usual one-step thermal oxidation process is non-uniform in thickness and extent. Such lack of thickness uniformity, i.e., non-homogeneity, in the wafer oxide layer 23 will randomly extend from wafer to wafer and from run to run, as noted above.

These drawbacks are avoided in accordance with the present invention.

Figure 3:
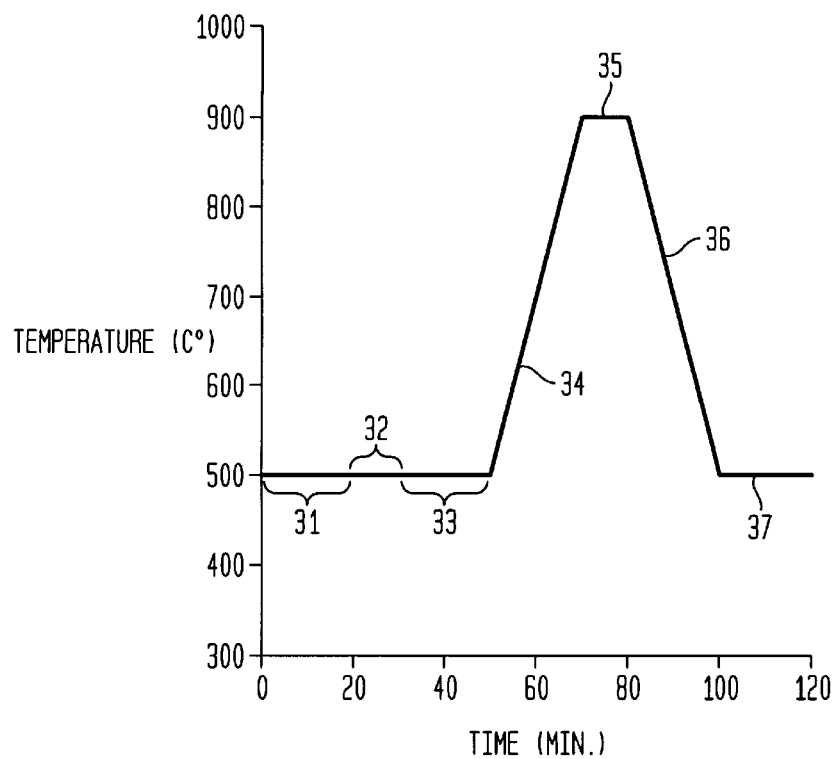
FIG. 3 is a graph having a curve of time versus temperature for the two-step progressive thermal oxidation process for growing a silicon dioxide layer in situ on a surface of a silicon semiconductor wafer in accordance with the present invention.

Referring now to FIG. 3, there is shown a graph having a curve of time in minutes (x-axis, abscissa) versus temperature in °C. (y-axis, ordinate), formed of curve sections 31—loading, 32—initial ramp up, 33—initial oxidation, 34—final ramp up, 35—final oxidation, 36—ramp down, and 37—unloading, for the two-step progressive thermal oxidation process for growing a silicon dioxide (oxide) layer in situ on a surface of a silicon semiconductor wafer according to the invention.

The graph of FIG. 3 illustrates an oxide layer formation process used in the IC fabrication of a semiconductor wafer for the two-step progressive thermal oxidation of a surface thereof in an oxidation furnace, e.g., a bottom end loaded vertical furnace of quartz, in accordance with the present invention. The process is as follows:

(1) A semiconductor wafer, e.g., at room temperature, i.e., about 20° C., is loaded, e.g., over a period of about 20 minutes, into the furnace, e.g., via a quartz boat containing a row of successive wafers inserted progressively upwardly into a bottom opening of the furnace such that the boat, upon completion of the loading, forms a closure for the furnace opening, in conventional manner, yet under an inert atmosphere, e.g., under a flushing flow of nitrogen ($N_2$), with the furnace being maintained at a low loading temperature e.g., of about 400–600° C., such as about 500° C. (curve section 31—loading).

(2) After the loading, the temperature of the furnace is initially "ramped up", i.e., increased, or adjusted, along with the temperature of the wafer, e.g., over a period of about 10 minutes, so as to provide a low oxidizing temperature, e.g., of about 400–600° C., such as about 500° C., while maintaining the wafer under such inert atmosphere, e.g., under a flushing flow of nitrogen (curve section 32—initial ramp up).

(3) The wafer surface is next subjected to initial oxidation, e.g., in dry oxygen ($O_2$), e.g., over a period of about 20 minutes, at the low oxidizing temperature, e.g., of about 400–600° C., such as about 500° C., sufficiently to form a substantially uniform initial thickness oxide layer, e.g., of up to about 10 angstroms thickness, in situ on the surface thereof (curve section 33—initial oxidation).

(4) The furnace temperature is thereafter increased, e.g., over a period of about 20 minutes, to a high oxidizing temperature, e.g., of about 700–1200° C., such as about 900° C., while maintaining the wafer under such inert atmosphere, e.g., under a flushing flow of nitrogen (curve section 34—final ramp up).

(5) The wafer surface is then subjected to final thermal oxidation, e.g., in oxygen and/or water vapor, at the high oxidizing temperature, e.g., of about 700–1200° C., such as about 900° C., e.g., over a period of about 10 minutes (curve section 35—final oxidation), sufficiently to increase uniformly in situ the oxide layer thereon to a selective final thickness, e.g., of about 20–100 angstroms.

(6) Thereafter, the resultant substantially uniform final thickness oxide layer-containing wafer is recovered from the furnace. In particular:

(6A) The furnace temperature is "ramped down", i.e., decreased, e.g., over a period of about 20 minutes, to a low unloading temperature, e.g., of about 400–600° C., such as about 500° C., under such inert atmosphere, e.g., under a flushing flow of nitrogen (curve section 36—ramp down).

(6B) Finally, the wafer is unloaded from the furnace, e.g., over a period of about 20 minutes (curve section 37—unloading), in conventional manner for further processing.

It is to be noted that the loading step (1) (curve section 31), initial ramp up step (2) (curve section 32) and initial oxidation step (3) (curve section 33) may be conveniently set at the same temperature, e.g., 500° C., so long as the loading step (1) and initial ramp up step (2) are effected under an inert atmosphere while the initial oxidation step (3) is effected in the presence of dry oxygen.

Alternatively, the initial ramp up step (2) and initial oxidation step (3) can be effected at a higher temperature than that of the loading step (1), yet lower than that of the final oxidation step (5). For instance, the loading step (1) may be effected at about 400° C., and the initial ramp up step (2) may be effected to increase that temperature to an initial oxidizing step temperature of about 500° C., with the initial oxidation step (3) being effected at such 500° C. while the final oxidizing step (5) is effected at about 900° C.

This is because the purpose of the loading step (1) and initial ramp up step (2) is to permit loading of the wafer into the furnace while the wafer is at as low a temperature as practicable, preferably at room temperature, and further to permit consequent gradual raising of its temperature in substantially stress-free manner to the initial oxidizing temperature, all while the wafer is under an inert atmosphere to protect it from spontaneous in situ oxide formation before the actual initial oxidation step (3).

Once the wafer reaches the desired initial oxidizing temperature, the initial oxidation step (3) can be efficiently carried out in the presence of dry oxygen, i.e., as a quasi-self limiting process as noted below (see FIG. 5), under generally steady state controlled oxidation rate conditions. This is followed by the final ramp up step (4) to the final oxidizing temperature under such inert atmosphere to protect the wafer from spontaneous in situ oxide growth, whereupon the remainder of the oxidizing of the wafer is effected by the final oxidation step (5) at the final oxidizing temperature in the presence of oxygen and/or water vapor, likewise under generally steady state controlled oxidation rate conditions.

Figure 4:
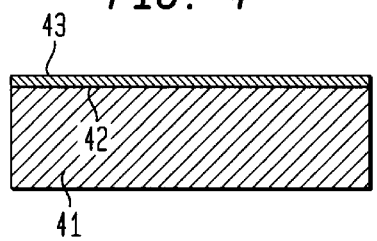
FIG. 4 is a side sectional view of a silicon semiconductor wafer having a silicon dioxide layer formed thereon per the two-step progressive oxidation process of the invention contemplated in FIG. 4.

FIG. 4 is a side sectional view of a silicon semiconductor wafer 41 having a surface 42 on which a silicon dioxide (oxide) layer 43 is formed in situ in accordance with the two-step progressive thermal oxidation process of the invention illustrated in FIG. 3. Unlike the silicon dioxide layer 23 formed in situ on the surface 22 of the prior art wafer 21 of FIG. 2, which is non-uniform in thickness and extent, and thus non-homogeneous in character, the silicon dioxide layer 43 formed in situ on the surface 42 of the wafer 41 according to the invention is continuous and highly uniform in thickness and extent throughout, and thus homogeneous in character, as is clear from FIG. 4. Such continuous and highly uniform thickness and extent characteristics of the wafer 41 according to the invention will favorably extend from wafer to wafer and from run to run.

Even though surface 22 of wafer 21 is typically precleaned so as to provide it as a substantially oxide layer-free surface, the prior art one-step oxidation process per FIG. 1 is carried out without sufficiently controlling the interim time between the wafer precleaning and the beginning of the oxidation (curve section 11—loading, and curve section 12—ramp up). As aforesaid, during this interim time, a new oxide layer 23 grows in situ randomly on surface 22, first at room temperature as a native oxide on exposure to ambient air and then as a low temperature oxide which grows during loading (curve section 11—loading) and further during ramp up to the high oxidizing temperature (curve section 12—ramp up).

Per the present invention, both the loading step (1) and the initial ramp up step (2), i.e., furnace temperature adjusting step, are effected under a protective flow of an inert atmosphere, e.g., of nitrogen gas, or of argon or other inert gas, so as to prevent premature random formation of an oxide layer on the given wafer surface. In turn, after the initial oxidation step (3), the final ramp up step (4) is likewise effected under a protective flow of such an inert atmosphere, as is the ramp down step (6) which follows the final oxidation step (5).

Wafer 41 is typically of circular disc shape with a diameter of about 8 inches (200 mm), and formed of silicon. In a typical actual fabrication run, about 80 individual wafers are situated as a row of successive wafers, i.e., stacked vertically one above the other in closely spaced apart relation, in the oxidation furnace boat and slowly loaded upwardly into the furnace under the protective flushing flow of an inert ambient such as nitrogen gas, for processing in accordance with the two-step progressive oxidation process of the invention.

Advantageously, the present invention permits the creation in situ on the semiconductor wafer of a very uniform thin first oxide layer by a first low temperature oxidation process under controlled ambient conditions throughout, followed by a second high temperature oxidation process to grow further the oxide layer to the desired selective final uniform thickness also under controlled ambient conditions throughout.

The overall processing sequence mainly contemplates the following steps:

the usual wafer precleaning step, e.g., chemical precleaning using a buffered HF etching solution;

a wafer loading step (1) in which the precleaned oxide layer-free wafer is loaded under an inert ambient into the oxidation furnace, which is maintained at a low loading temperature, e.g., of about 500° C., at the lowest possible wafer temperature, and preferably at a wafer temperature of room temperature, i.e., about 20° C.;

an initial ramp up step (2) in which the furnace temperature is adjusted, e.g., raised to or maintained at a low oxidizing temperature, e.g., of about 500° C., under an inert ambient, but in any case such that the wafer temperature is raised to the low oxidizing temperature, e.g., from room temperature;

a low temperature initial oxidation step (3) in which the wafer is subjected to oxidation, e.g., in the presence of dry oxygen gas for about 10–30 minutes, sufficiently to form a uniform initial thin oxide layer in situ on the given wafer surface;

a final ramp up step (4) in which the furnace temperature is raised to a final oxidizing temperature, e.g., of about 900° C., under an inert ambient; and a high temperature final oxidation step (5) in which the wafer is subjected to further oxidation, e.g., in the presence of oxygen gas and/or water vapor for about 5–15 minutes, sufficiently to increase the oxide layer to a selective uniform final thickness.

The wafer is then recovered (6), e.g., by the step (6A) of decreasing the furnace temperature under an inert ambient to a low unloading temperature, e.g., of about 500° C., sufficiently to unload the wafer without further oxidation of its surface, followed by the step (6B) of unloading the wafer from the furnace.

It is to be noted that the initial low temperature oxidation step (3) according to the invention is effected at such a relatively low temperature that the oxidation is inherently a quasi-self limiting process. This means that the in situ oxide layer initially grows very fast, but the growth rate slows down significantly when a certain oxide thickness is reached. This self-limiting initial thickness depends on the oxidizing temperature.

More specifically, at about 500° C., this initial thickness is of the order of about 10 angstroms (0.001 micron, 1 nm), which is only slightly above the thickness of the native oxide formed at room temperature, i.e., about 20° C., in ambient air. Indeed, all surface sites on the wafer will uniformly reach this initial oxidation thickness of about 10 angstroms when the oxidation time has been chosen to be sufficiently long.

Figure 5:
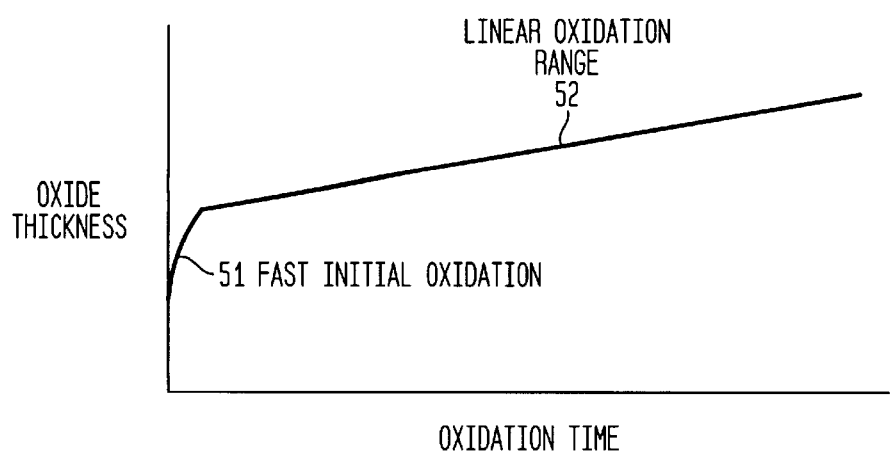
FIG. 5 is a graph having a curve of thermal oxidation time versus oxide layer thickness for the first step of the two-step progressive thermal oxidation process of the present invention.

Referring now to FIG. 5, there is shown a graph having a curve 50 of thermal oxidation time in minutes (x-axis, abscissa) versus oxide layer thickness in angstroms (y-axis, ordinate), formed of curve sections 51—fast initial oxidation and 52—linear oxidation range which are separated by transition point—53, for the initial oxidation step (3) in accordance with the invention.

The graph of FIG. 5 illustrates the effect of the initial oxidation step (3), with the curve 50 depicting oxide layer thickness as a function of oxidation time for thin thermal oxide layers, e.g., of up to about 10 angstroms, per the fast initial oxidation section 51 and linear oxidation range section 52, as contemplated herein. This is to be distinguished from large thermal oxide layer thicknesses, i.e., well above 100 angstroms, per a parabolic oxidation range (not shown).

The initial thermal oxidation step (3), after insertion of the wafers into the oxidation furnace by the loading step (1) and increasing the temperature of the wafers during the initial ramp up step (2), and upon exposure of the wafers to the oxidizing ambient, e.g., dry oxygen, is very fast. It is completed after approximately one minute as depicted by fast initial oxidation curve section 51 (steep, substantially vertical curve section), which changes at transition point 53 to the linear oxidation range curve section 52 (flat, substantially horizontal curve section).

For longer initial oxidation times, i.e., beyond about one minute (steep curve section 51), the thermal oxidation is effected at a linear oxidation rate over the linear oxidation range flat curve section 52. This linear oxidation rate depends on the temperature. The linear oxidation rate per flat curve section 52 is below about 0.1 angstrom per minute (A/min) where the temperature is chosen to be sufficiently low, e.g., 500° C., as noted above.

Therefore, all wafers will have an oxide layer with a thickness determined by the initial oxidation step (3) after a significant period of time in the oxidation furnace at this low initial oxidation temperature (steep curve section 51), and only a negligible contribution to the oxide layer thickness will be made thereafter by the linear oxidation (flat curve section 52).

As a result, the present invention creates more ideal or uniform starting conditions for the thermal oxidation of the wafer which render less important or inconsequential any uncontrolled formation of an oxide layer during the interim time between a wafer precleaning step and the beginning of the thermal oxidation. The present invention provides the following particular advantages:

All wafers will have the same oxide layer thickness at all locations on the wafer surface at the end of the low temperature initial oxidation step (3).

The oxide layer thickness is independent of the wafer loading procedure, which inherently loads different wafers in the quartz boat at different times into the oxidation furnace depending on their relative successive position in the boat as it is progressively loaded into the furnace.

During the long low temperature initial oxidation step (3), per curve 50 in FIG. 5, the furnace stabilizes thermally. In addition, any ambient gases stemming from the loading step (1) are purged from the furnace during the loading step (1) and also during the initial ramp up step (2).

The final oxide layer thickness, e.g., up to at most about 10 angstroms, after the low temperature initial oxidation step (3), is also independent of the time between the wafer precleaning step and the wafer loading step (1).

As depicted in FIG. 5, the low temperature initial oxidation step (3) is quasi-self limiting because a sufficiently low temperature is chosen for the low temperature initial oxidation step (3) for providing an extremely low overall linear oxidation rate, e.g., below about 0.1 A/min (per flat curve section 52), as aforesaid. Therefore, the low temperature initial oxidation step (3) selectively produces very convenient and reproducible starting conditions for all wafers in the quartz boat for the ensuing high temperature final oxidation step (5).

In accordance with the present invention, therefore, the history of the given wafer with respect to the interim time between the contemplated precleaning step and the step of loading the wafer into the oxidation furnace is now less important or inconsequential, as is also true of the tendency toward non-homogeneity, i.e., non-uniformity, of the oxide layer grown in ambient air after the precleaning step, or of such layer upon further growth during the loading step, per the prior art one-step thermal oxidation process. Indeed, these drawbacks are obviated by the two-step progressive thermal oxidation process of the invention.

The two-step progressive thermal oxidation process for producing a thin oxide layer according to the invention is to be distinguished from the gross oxide layer thickness thermal oxidation of a surface of a wafer such as of silicon (Si) which consumes the surface silicon by in situ formation of a thick layer of silicon dioxide ($SiO_2$), i.e., well above 100 angstroms thickness, whereby the $Si/SiO_2$ interface progressively descends into the thick silicon dioxide (oxide layer) mass as it is converted to the oxide over a parabolic oxidation range. Since the oxygen atoms serving as oxidant must diffuse progressively increasing distances into the depth of such thick oxide layer mass, in order to react with the silicon at the interface as the oxide layer thickness increases, the thickness growth rate of the oxide layer concordantly progressively decreases until such self-limiting oxide layer thickness growth is reached for the particular oxidizing temperature.

Accordingly, it can be appreciated that the specific embodiments described are merely illustrative of the general principles of the invention. Various modifications may be provided consistent with the principles set forth.

What is claimed is:

1. A process for improving the thickness uniformity of an oxide layer formed on a surface of each of a plurality of semiconductor wafers comprising the steps in combination of:

loading a row of successive semiconductor wafers constituting said plurality of wafers, each wafer having a surface which is subject to formation of an oxide layer thereon but which is substantially oxide layer-free, progressively into an oxidation furnace under an inert atmosphere while maintaining the furnace at a low loading temperature;

adjusting the temperature of the wafers in the furnace to a low oxidizing temperature while maintaining the wafers under an inert atmosphere;

subjecting the wafers to initial oxidation at the low oxidizing temperature sufficiently to form a substantially uniform initial thickness oxide layer on the corresponding wafer surface;

increasing the temperature of the furnace to a high oxidizing temperature while maintaining the wafers under an inert atmosphere;

subjecting the wafers to final oxidation at the high oxidizing temperature sufficiently to increase uniformly the thickness of the corresponding oxide layer to a selective final thickness; and recovering the resultant substantially uniform final thickness oxide layer-containing wafers from the furnace.

2. The process of claim 1 wherein the recovering of the wafers includes the further steps of:

decreasing the temperature of the furnace to a low unloading temperature under an inert atmosphere sufficiently for unloading the wafers from the furnace without significant further oxidation of the corresponding wafer surface; and unloading the resultant substantially uniform final thickness oxide layer-containing wafers from the furnace.

3. The process of claim 1 wherein the low loading temperature is about 400–600° C., the low oxidizing temperature is about 400–600° C., and the high oxidizing temperature is about 700–1200° C.

4. The process of claim 2 wherein the low unloading temperature is about 400–600° C.

5. The process of claim 3 wherein the wafers are subjected to oxidation at the low oxidizing temperature for about 15–30 minutes at about 1 atm pressure, the temperature is increased from the low oxidizing temperature to the high oxidizing temperature over a period of about 15–30 minutes, and the wafers are subjected to oxidation at the high oxidizing temperature for about 5–15 minutes at about 1 atm pressure.

6. The process of claim 1 wherein the oxidation at the low oxidizing temperature is carried out in the presence of dry oxygen, and the oxidation at the high oxidizing temperature is carried out in the presence of oxygen and/or water vapor.

7. The process of claim 1 wherein the oxidation at the low oxidizing temperature is carried out sufficiently to form a corresponding oxide layer having an initial thickness of up to about 10 angstroms, and the oxidation at the high oxidizing temperature is carried out sufficiently to increase the corresponding oxide layer to a final thickness of about 20–100 angstroms.

8. The process of claim 1 wherein each wafer comprises silicon and the corresponding oxide layer comprises silicon dioxide.

9. The process of claim 1 wherein the surface of each wafer has been precleaned to provide such surface in substantially oxide layer-free condition.

10. A process for improving the thickness uniformity of a thin oxide layer on each of a plurality of semiconductor wafers comprising the steps in combination of:

loading a row of successive semiconductor wafers constituting said plurality of wafers, each wafer having a surface which is subject to formation of an oxide layer thereon but which is substantially oxide layer-free, progressively into an oxidation furnace under an inert atmosphere while maintaining the furnace at a low loading temperature of about 400–600° C.;

adjusting the temperature of the wafers in the furnace to a low oxidizing temperature of about 400–600° C. while maintaining the wafers under an inert atmosphere;

subjecting the wafers to initial oxidation at the low oxidizing temperature sufficiently to form a substantially uniform initial thickness oxide layer on the corresponding wafer surface;

increasing the temperature of the furnace to a high oxidizing temperature of about 700–1200° C. while maintaining the wafers under an inert atmosphere;

subjecting the wafers to final oxidation at the high oxidizing temperature sufficiently to increase uniformly the thickness of the corresponding oxide layer to a selective final thickness;

decreasing the temperature of the furnace to a low unloading temperature of about 400–600° C. under an inert atmosphere sufficiently for unloading the wafers from the furnace without significant further oxidation of the surface; and unloading the resultant substantially uniform final thickness oxide layer-containing wafers from the furnace.

11. The process of claim 10 wherein the oxidation at the low oxidizing temperature is carried out in the presence of dry oxygen, and the oxidation at the high oxidizing temperature is carried out in the presence of oxygen and/or water vapor.

12. The process of claim 10 wherein the oxidation at the low oxidizing temperature is carried out sufficiently to form a corresponding oxide layer having an initial thickness of up to about 10 angstroms, and the oxidation at the high oxidizing temperature is carried out sufficiently to increase the corresponding oxide layer to a final thickness of about 20–100 angstroms.

13. The process of claim 10 wherein each wafer comprises silicon and the corresponding oxide layer comprises silicon dioxide.

14. The process of claim 10 wherein the surface of each wafer has been precleaned to provide such surface in substantially oxide layer-free condition.

15. A process for improving the thickness uniformity of a thin oxide layer on each of a plurality of semiconductor wafers comprising the steps in combination of:

loading a row of successive silicon semiconductor wafers constituting said plurality of semiconductor wafers, each wafer having a surface which is subject to formation of a silicon dioxide layer thereon but which is substantially oxide layer-free, progressively into an oxidation furnace under an inert atmosphere while maintaining the furnace at a low loading temperature;

adjusting the temperature of the wafers in the furnace to a low oxidizing temperature while maintaining the wafers under an inert atmosphere;

subjecting the wafers to initial oxidation at the low oxidizing temperature sufficiently to form a substantially uniform initial thickness silicon dioxide layer of up to about 10 angstroms on the corresponding wafer surface;

increasing the temperature of the furnace to a high oxidizing temperature while maintaining the wafers under an inert atmosphere;

subjecting the wafers to final oxidation at the high oxidizing temperature sufficiently to increase uniformly the thickness of the corresponding silicon dioxide layer to a selective final thickness of about 20–100 angstroms;

decreasing the temperature of the furnace to a low unloading temperature under an inert atmosphere sufficiently for unloading the wafers from the furnace without significant further oxidation of the corresponding surface; and unloading the resultant substantially uniform final thickness silicon dioxide layer-containing wafers from the furnace.

16. The process of claim 15 wherein the low loading temperature is about 400–600° C., the low oxidizing temperature is about 400–600° C., the high oxidizing temperature is about 700–1200° C., the low unloading temperature is about 400–600° C., the wafers are subjected to oxidation at the low oxidizing temperature for about 15–30 minutes at about 1 atm pressure, the temperature is increased from the low oxidizing temperature to the high oxidizing temperature over a period of about 15–30 minutes, and the wafers are subjected to oxidation at the high oxidizing temperature for about 5–15 minutes at about 1 atm pressure.

17. The process of claim 15 wherein the oxidation at the low oxidizing temperature is carried out in the presence of dry oxygen, and the oxidation at the high oxidizing temperature is carried out in the presence of oxygen and/or water vapor.

18. The process of claim 15 wherein the surface of each wafer has been precleaned to provide such surface in substantially oxide layer-free condition.

* * * * *